United States Patent
Zhu et al.

(10) Patent No.: US 9,246,071 B2
(45) Date of Patent: Jan. 26, 2016

(54) MANUFACTURING METHOD OF GRATING

(71) Applicants: Tsinghua University, Beijing (CN); HON HAI PRECISION INDUSTRY CO., LTD., New Taipei (TW)

(72) Inventors: Zhen-Dong Zhu, Beijing (CN); Qun-Qing Li, Beijing (CN); Li-Hui Zhang, Beijing (CN); Mo Chen, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/470,814

(22) Filed: Aug. 27, 2014

(65) Prior Publication Data

US 2014/0367357 A1    Dec. 18, 2014

Related U.S. Application Data

(63) Continuation of application No. 13/658,029, filed on Oct. 23, 2012, now Pat. No. 8,853,096.

(30) Foreign Application Priority Data

Oct. 28, 2011    (CN) .......................... 2011 1 0333523

(51) Int. Cl.
*B29D 11/00*    (2006.01)
*H01L 33/50*    (2010.01)
*G03F 7/00*    (2006.01)
(Continued)

(52) U.S. Cl.
CPC ............... *H01L 33/508* (2013.01); *B82Y 10/00* (2013.01);
(Continued)

(58) Field of Classification Search
CPC .................. H01L 21/31133; H01L 21/31128; H01L 21/31144; H01L 33/508; G02B 5/18; G02B 5/1809; G02B 5/1857; B28Y 10/00
USPC .......... 216/24, 41, 64, 67; 438/706, 710, 712, 438/714, 719
See application file for complete search history.

(56) References Cited

U.S. PATENT DOCUMENTS 7,005,335 B2    2/2006    Ghozeil et al.
8,853,096 B2 *  10/2014   Zhu et al. ..................... 438/714
(Continued)

FOREIGN PATENT DOCUMENTS

CN          1495854      5/2004
CN          100401500    7/2008

*Primary Examiner* — Lan Vinh
(74) *Attorney, Agent, or Firm* — Novak Druce Connolly Bove + Quigg LLP

(57) ABSTRACT

The disclosure relates to a method for making a grating. The method includes the following steps. First, a substrate is provided. Second, a photoresist film is formed on a surface of the substrate. Third, a nano-pattern is formed on the photoresist film by nano-imprint lithography. Fourth, the photoresist film is etched to form a patterned photoresist layer. Fifth, a mask layer is covered on the patterned photoresist layer and the surface of the substrate exposed to the patterned photoresist layer. Sixth, the patterned photoresist layer and the mask layer thereon are removed to form a patterned mask layer. Seventh, the substrate is etched through the patterned mask layer by reactive ion etching, wherein etching gases includes carbon tetrafluoride, sulfur hexafluoride, and argon. Finally, the patterned mask layer is removed.

14 Claims, 8 Drawing Sheets

(51) Int. Cl.
*B82Y 10/00* (2011.01)
*B82Y 40/00* (2011.01)
*G02B 5/18* (2006.01)
*G03F 7/095* (2006.01)

(52) U.S. Cl.
CPC .............. *B82Y 40/00* (2013.01); *G02B 5/1809* (2013.01); *G02B 5/1857* (2013.01); *G03F 7/0002* (2013.01); *G02B 5/18* (2013.01); *G03F 7/095* (2013.01)

(56) References Cited

U.S. PATENT DOCUMENTS

| | | | |
|---|---|---|---|
| 2004/0217086 A1* | 11/2004 | Kawashima | 216/41 |
| 2008/0233730 A1* | 9/2008 | Yu et al. | 438/596 |
| 2010/0285167 A1* | 11/2010 | Sandhu et al. | 425/385 |
| 2010/0320466 A1* | 12/2010 | Chen et al. | 257/59 |
| 2011/0042301 A1* | 2/2011 | Zhang et al. | 210/500.21 |
| 2011/0244398 A1* | 10/2011 | Huang et al. | 430/323 |

* cited by examiner

———— Grating obtained with the flow volume of the etching gases between 40 sccm and 120 sccm – – – – – – Grating obtained with the flow volume of the etching gases smaller than 40 sccm —·—·—·— Grating obtained with the flow volume of the etching gases greater than 120 sccm

MANUFACTURING METHOD OF GRATING

This application is a continuation of U.S. patent application Ser. No. 13/658,029, filed on Oct. 23, 2012, entitled, "MANUFACTURING METHOD OF GRATING," which claims all benefits accruing under 35 U.S.C. §119 from China Patent Application 201110333523.4, filed on Oct. 28, 2011 in the China Intellectual Property Office, the disclosure of which is incorporated herein by reference. The disclosures of the above-identified applications are incorporated herein by reference.

BACKGROUND

1. Technical Field

The disclosure relates to a manufacturing method of a grating.

2. Description of Related Art

A sub-wavelength grating is a common optical component in the semiconductor industry. The size of the sub-wavelength grating is similar to or less than the active wavelength of the sub-wavelength grating. It is difficult to make a quartz grating with high density, sub-wavelength, and mark-space ratio. The sub-wavelength grating may be made by electron beam lithography, focused ion beam lithography, deep-ultraviolet lithography, holographic lithography, and nano-imprint lithography.

In the prior art, the aspect ratio of the sub-wavelength grating is 1:1 so as to limit the application field.

BRIEF DESCRIPTION OF THE DRAWINGS

The parts in the drawings are not necessarily drawn to scale, the emphasis instead being placed upon clearly illustrating the principles of at least one embodiment. In the drawings, like reference numerals designate corresponding parts throughout the various diagrams, and all the diagrams are schematic.

DETAILED DESCRIPTION

Reference will now be made to the drawings to describe various inventive embodiments of the present disclosure in detail, wherein like numerals refer to like elements throughout.

Figure 1:
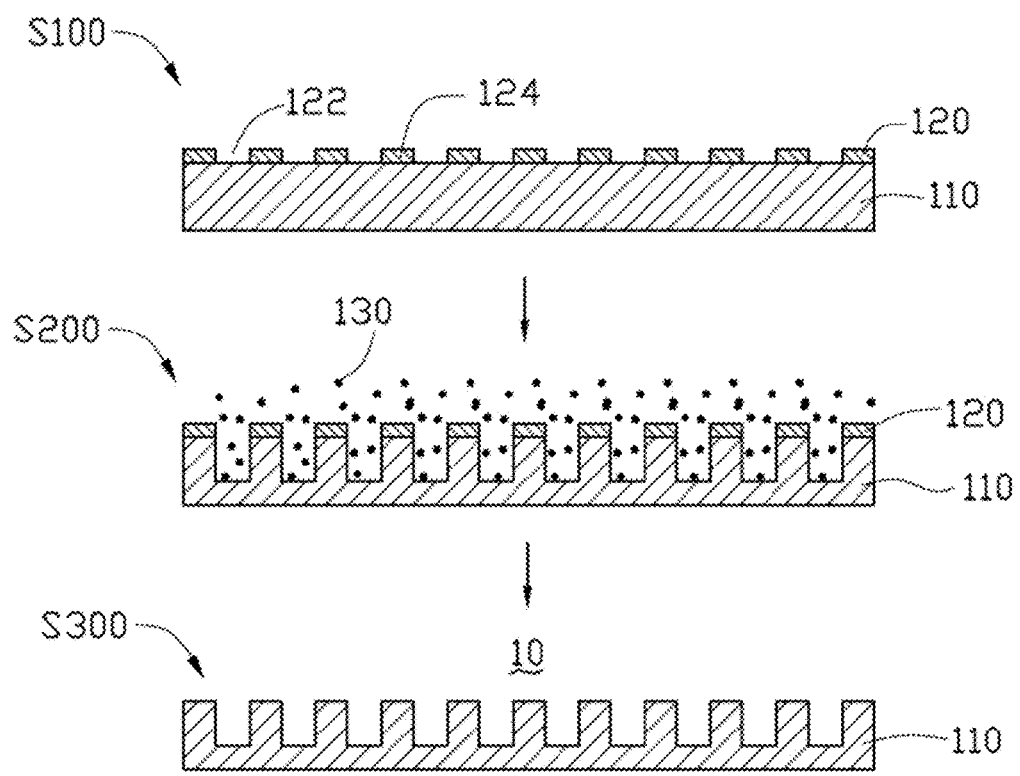
FIG. 1 is a schematic diagram showing one embodiment of a manufacturing method of a grating.
Figure 2:
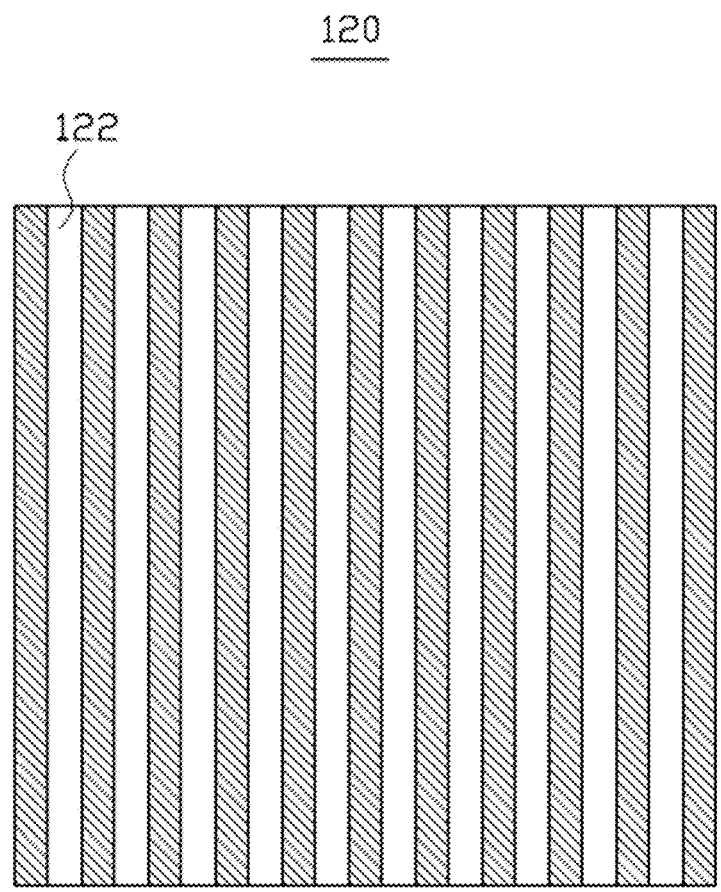
FIG. 2 is a top-view of a patterned mask layer used in the method of FIG. 1.

Referring to FIG. 1, one embodiment of a manufacturing method of a grating 10 includes the following steps. The grating 10 can be a sub-wavelength grating.

In step S100, a substrate 110 is provided, and a patterned mask layer 120 is formed on a surface of the substrate 110.

The substrate 110 can be a circular plate, a square plate, or any other shape plate. The substrate 110 may be a semiconductor substrate or a silicon substrate. The material of the substrate 110 may be gallium nitride (GaN), gallium arsenide (GaAs), sapphire, aluminum oxide, magnesium oxide, silicon, silica, silicon nitride, or silicon carbide, wherein the silica may form a quartz substrate or a glass substrate. In the embodiment, the substrate 110 is a quartz substrate.

In addition, the patterned mask layer 120, which is made by a photoresist film, has a plurality of mask strips 124 and a plurality of first nanometer scale cavities 122 arranged in intervals. A part of the surface of the substrate 110 is exposed to the patterned mask layer 120 through the first cavities 122. The nano-pattern of the patterned mask layer 120 can be a continuous pattern or a discontinuous pattern. In the embodiment, the material of the patterned mask layer 120 is chromium, the mask strips 124 and the first cavities 122 are arranged with regular intervals, the width of each first cavity 122 is about 100 nm, and the depth of each cavity 122 is about 40 nm.

In step S200, the substrate 110 with the patterned mask layer 120 is placed in a microwave plasma system (not shown), and an etching gas 130 having carbon tetrafluoride ($CF_4$), sulfur hexafluoride ($SF_6$) and argon ($Ar_2$) is guided into the microwave plasma system to etch the substrate 110 exposed to the patterned mask layer 120.

In step S300, the patterned mask layer 120 is removed to obtain a grating 10 having a high aspect-ratio. In the embodiment, the high aspect-ratio is equal to or greater than 6:1.

Figure 3:
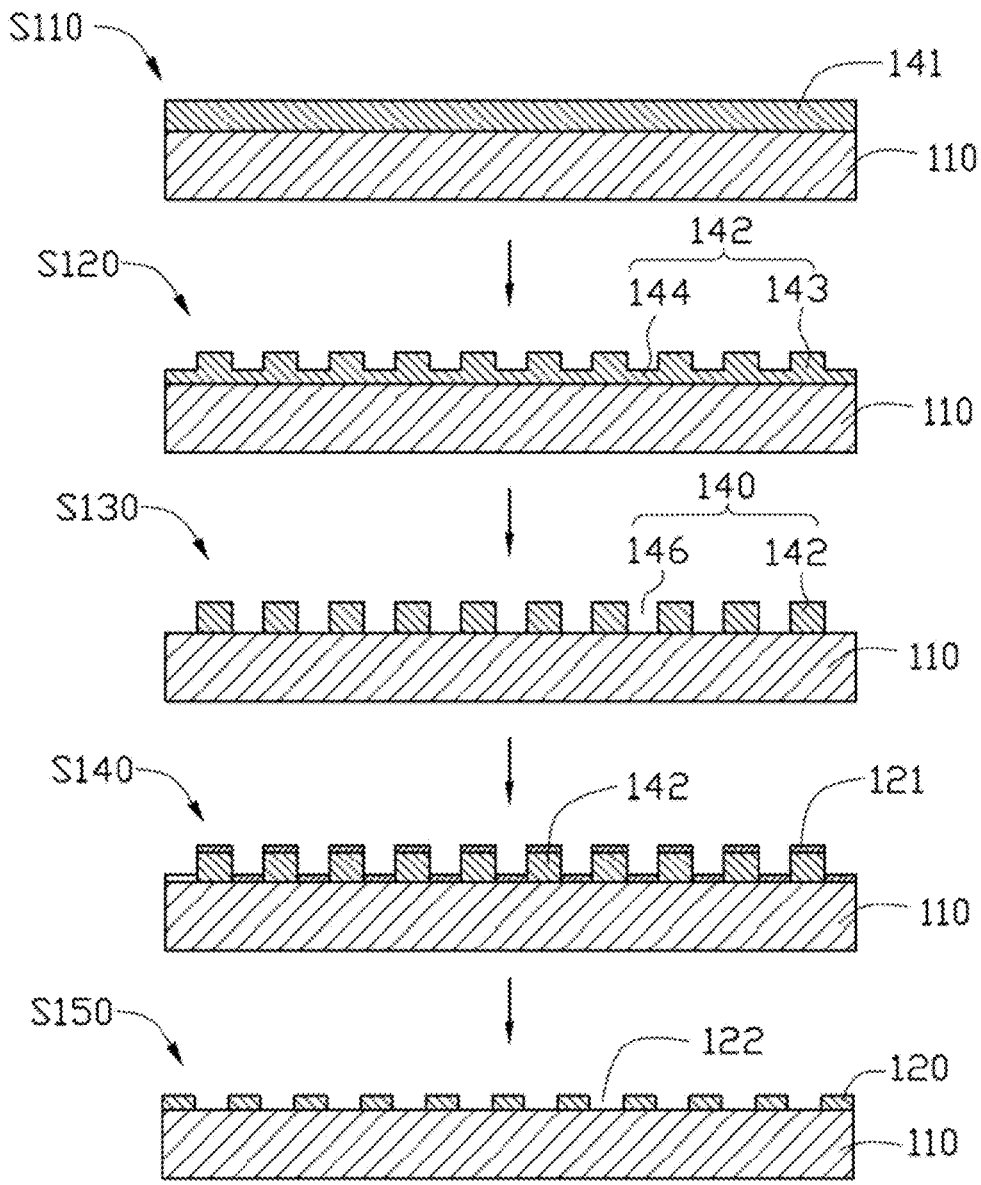
FIG. 3 is a schematic diagram showing one embodiment of a detail manufacturing method of a grating.

Referring to FIG. 3, the method for making the patterned mask layer 120 on the substrate 110 includes the following steps.

In step S110, a photoresist film 141 is disposed on the surface of the substrate 110. The photoresist film 141 for protecting the substrate 110 can be a single layer or a multi-layer film. The material of the single layer may be ZEP520A, hydrogen silsesquioxane (HSQ), Polystyrene (PS), Polymethylmethacrylate (PMMA), AR-N series, AR-Z series, AR-B series, SAL-601, or organic silicon oligomer. In one embodiment, the photoresist film 141 is a two layer structure. The material of one layer of the photoresist film 141 is PMMA and the other layer is hydrogen silsesquioxane (HSQ), wherein the PMMA layer is disposed adjacent to the substrate 110.

Step S110 can further include the steps S112 to S118.

In step S112, the substrate 110 is cleaned according to cleanroom standards.

In step S114, the PMMA layer is formed on the surface of the substrate 110 by spin coating. The thickness of the PMMA layer is in the range of about 100 nm to about 500 nm.

In step S116, a transitional layer is formed to cover the PMMA layer by sputtering or depositing. In the embodiment, the material of the transitional layer is silica, which is deposited on the PMMA layer. The thickness of the transitional layer is in the range of about 10 nm to about 100 nm.

In step S118, the HSQ layer is formed to cover on the transitional layer by bead coating or spin coating. In the embodiment, the HSQ layer is formed on the transitional layer by spin coating with high pressure. The thickness of the HSQ layer is in the range of about 100 nm to about 500 nm, and preferably in the range of about 100 nm to about 300 nm.

In step S120, a nano-pattern is formed on the photoresist film 141 by nano-imprint lithography. A plurality of protrusions 142 and a plurality of cavities 144 are formed on the photoresist film 141. Step S120 can further include the steps S122 to S126.

In step S122, a mold with a nano-pattern is provided, wherein the nano-pattern is disposed on a surface of the mold. The nano-pattern includes a plurality of protrusions and a plurality of cavities. Each cavity is defined between two protrusions. In the embodiment, the mold is a transparent material, which may be made of silica, quartz, or diboride glass.

In step S124, the surface with the nano-pattern of the mold is attached to the HSQ layer of the photoresist film 141, and a force is provided to map the nano-pattern from the mold to the photoresist film 141 under normal atmospheric temperature. In one embodiment, the nano-pattern is only formed at the HSQ layer, and the PMMA is intact.

In step S126, the mold is removed from the substrate 110 so as to form the protrusions 142 and the cavities 144 on the photoresist film 141. The protrusions 142 correspond to the cavities of the mold, and the cavities 144 corresponding to the protrusions of the mold.

In step S130, the photoresist film 141 located at the cavities 144 are removed to form a patterned photoresist layer 140 with a plurality of second cavities 146. A part of the surface of the substrate 110 is exposed to the patterned photoresist layer 140 through the second cavity 146. Step S130 can further include steps S132 and S134.

In step S132, the substrate 110 is placed in a microwave plasma system, and a reaction gas $CF_4$ is guided into the microwave plasma system to remove the HSQ layer located at the cavities 144. The microwave plasma system is operated in reaction-ion-etching (RIE) mode. During the RIE mode, an induced power source generates $CF_4$ plasma, wherein the $CF_4$ plasma with low ion energy is diffused from the generation area to the surface of the substrate 110 to etch the HSQ layer located at the cavities 144. During the process, the power of the microwave plasma system is about 40 watts (W), the volume flow of the $CF_4$ plasma is about 26 sccm, the pressure in the microwave plasma system is about 2 pascal (pa), and the etching time is about 10 seconds. The HSQ layer located at the cavities 144 is removed and a part of the PMMA layer is exposed after above process. The thickness of the HSQ layer located at the protrusions is reduced after the step S132.

In step S134, a reaction gas $O_2$ is guided into the microwave plasma system to remove the PMMA layer located at the cavities 144 to form a plurality of second cavities 146 to expose a part of the surface of substrate 110. During the process, the power of the microwave plasma system is about 40 W, the volume flow of the $O_2$ plasma is about 40 sccm, the pressure in the microwave plasma system is about 2 pa, and the etching time is about 120 seconds. The HSQ layer can be a mask during the process of removing the PMMA layer to increase etching precision. In one embodiment, the depth of one of the second cavity 146 is in the range of about 100 nm to about 500 nm and the width of one of the second cavity 146 is in the range of about 25 nm to about 150 nm.

In step S140, a mask layer 121 is deposited on the patterned photoresist layer 140 and the surface of the substrate 110 exposed to the patterned photoresist layer 140. A mask layer 121 is formed on the patterned photoresist layer 140 and the surface of the substrate 110 exposed to the second cavities 146. The material of the mask layer 121 can be chromium, and the thickness of the mask layer 121 is about 40 nm.

In step S150, the patterned photoresist layer 140 and the mask layer 121 on the protrusions are removed to form a patterned mask layer 120. The patterned photoresist layer 140 can be removed by Tetrahydrofuran (THF), acetone, methyl ethyl ketone, cyclohexane, n-hexane, methyl alcohol, or ethyl alcohol. The mask layer 121 covered on the patterned photoresist layer 140 is also removed with the patterned photoresist layer 140 to form the patterned mask layer 120. The patterned mask layer 120 is formed on the surface of the substrate. In one embodiment, the patterned photoresist layer 140 and the mask layer 121 thereon is removed by ultrasonic cleaner and acetone.

Another method for making the patterned mask layer includes the steps of forming a chromium layer on the surface of the substrate 110, forming a photoresist on a surface of the chromium layer, patterning the photoresist by photolithography to expose a part of the chromium layer, removing the chromium layer exposed to the photoresist by electron beam bombardment, and removing the photoresist to form a patterned chromium layer. The patterned chromium layer can be the patterned masked layer.

The mark-space ratio of the patterned mask layer 120 is 1:1, and the width of the first cavity 122 is in the range of about 25 nm and about 150 nm.

In step S200, the microwave plasma system is operated under RIE mode. The etching gases include $CF_4$, $SF_6$, and $Ar_2$, which are generated by an induced power source of the microwave plasma system. During the etching process, the $CF_4$ and $SF_6$ etching gas easily react with the substrate 110 to produce a silicon fluoride compounds. The silicon fluoride compounds can easily adhere to the exposed surface of the substrate 110 to block the substrate 110 etched by the etching gas of $CF_4$ and $SF_6$. However, the bombardment of the $Ar_2$ etching gas can decompose the silicon fluoride compounds so that the $CF_4$ and $SF_6$ etching gases can etch the substrate 110 again to obtain the cavity with greater depth.

The volume flow of the etching gases is in the range of about 40 sccm and about 120 sccm, wherein the flow volume of $CF_4$ is in the range of about 1 sccm and about 50 sccm, the flow volume of $SF_6$ is in the range of about 10 sccm and about 70 sccm, and the flow volume of $Ar_2$ is in the range of about 10 sccm and about 20 sccm. In one embodiment, the flow volume of the etching gas is about 70 sccm.

The etching gas further includes $O_2$, and the flow volume of $O_2$ is in the range of greater than 0 sccm to about 10 sccm. The etching gases of $CF_4$, $SF_6$, $Ar_2$, and $O_2$ are guided into the microwave plasma system simultaneously to assist the burning of the silicon fluoride compounds. In addition, the reaction between the substrate 110 and $O_2$ produces a chemical compound having silicon-oxygen bond and silicon-carbon bond, which is burned by $Ar_2$ to speed up the etching time.

Figure 4:
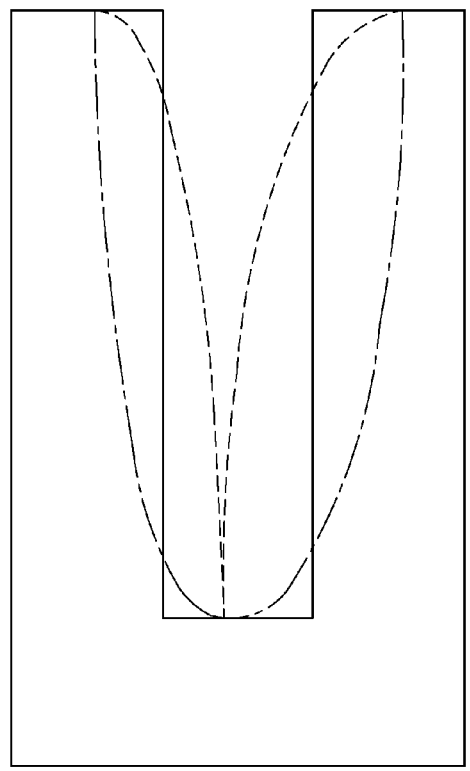
FIG. 4 is a cross-sectional diagram of one cavity of the grating of FIG. 1.

Referring to FIG. 4, the different flow volume of the etching gas produces the different shape of the cavities. The cross-section of the cavity is V-shaped if the flow volume of the etching gases are less than 40 sccm. The cross-section of the cavity is a U-shaped if the flow volume of the etching gases are greater than 120 sccm. The wall of the cavity is about perpendicular to the surface of the substrate 110 when the flow volume of the etching gases are in the range of about 40 sccm and about 120 sccm.

In addition, a pressure of the etching gases is in the range of about 1 pa to about 5 pa, and an etching power is in the range of about 40 W to about 200 W. In the embodiment, the flow volume of $CF_4$ is about 40 sccm, the flow volume of $SF_6$ is about 26 sccm, the flow volume of $Ar_2$ is about 10 sccm, the pressure of the etching gases is about 2 pa, and the etching power is about 70 W. Under the above condition, the etching depth is about 600 nm when the etching time is about 8 mins, and the etching depth is about 750 nm when the etching time is about 10 mins.

The step S300 can further include steps S302 and S304 if the material of the patterned mask layer 120 is chromium.

In step S302, a chromium etchant ($K3[Fe(CN)6]$) is provided, wherein the concentration of the $K3[Fe(CN)6]$ is in the range of about 0.06 mol/L and about 0.25 mol/L.

In step S304, the substrate 110 is dipped in the chromium etchant for about 4 mins to about 15 mins to remove the patterned mask layer 120.

The present disclosure provides has many advantages. The silicon fluoride compounds can be bombarded by $Ar_2$ to continue the etching process to obtain the grating 10 with a high aspect ratio greater than or equal to 6:1. The flow volume of the etching gas is controlled in the range of about 40 sccm to about 120 sccm to ensure the wall of the cavities of the substrate 110 is substantially perpendicular. The width and the depth of the cavities of the substrate 110 can be controlled under a particular condition. One condition includes $CF_4$, $SF_6$, and $Ar_2$ etching gases flowing in the range of about 40 sccm to about 120 sccm, the pressure of the etching gas is in the range of about 1 pa to about 5 pa, and the etching power of the microwave plasma system is in the range of about 40 W and about 200 W.

Figure 5:
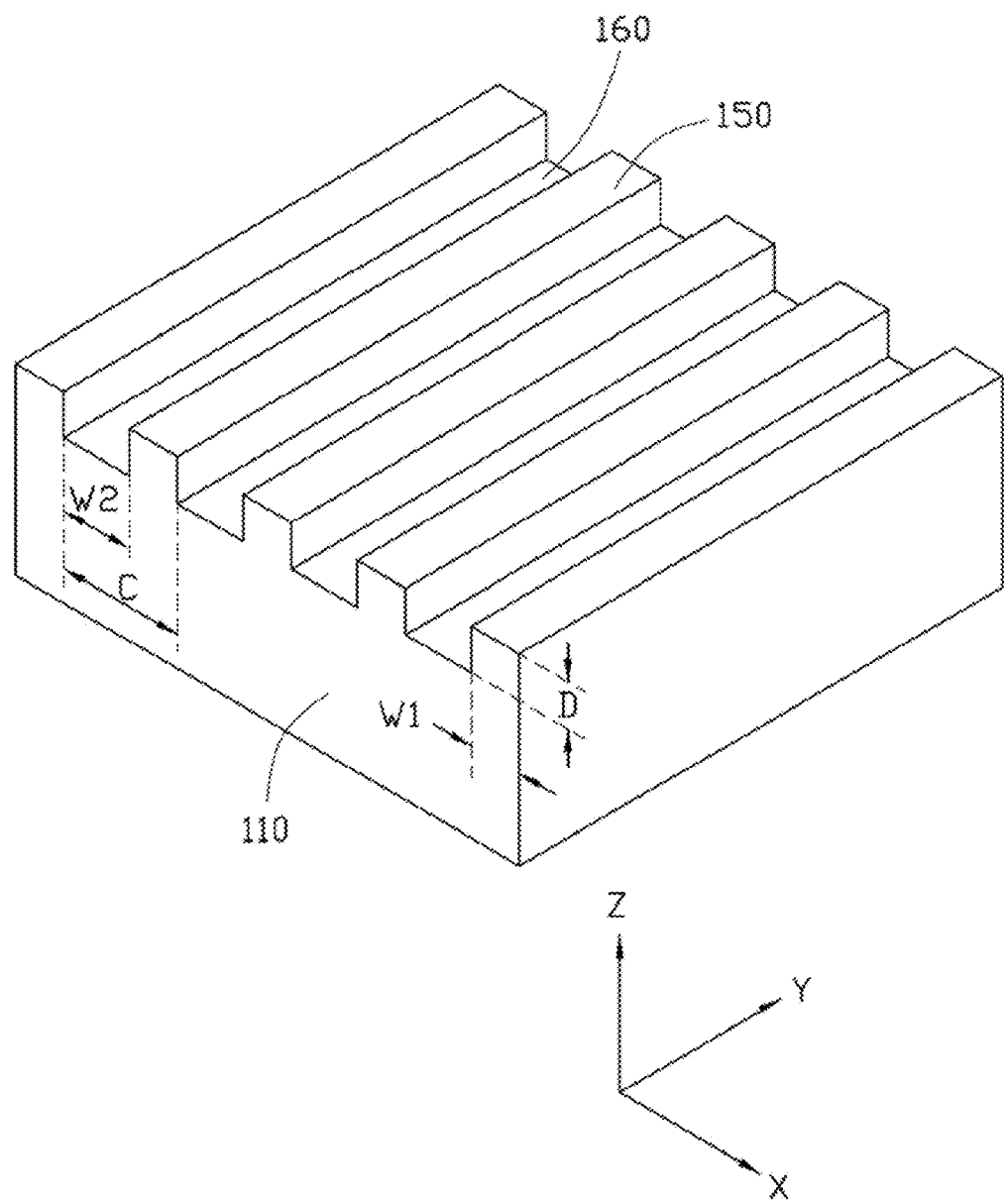
FIG. 5 is one embodiment of a schematic diagram of the grating.
Figure 6:
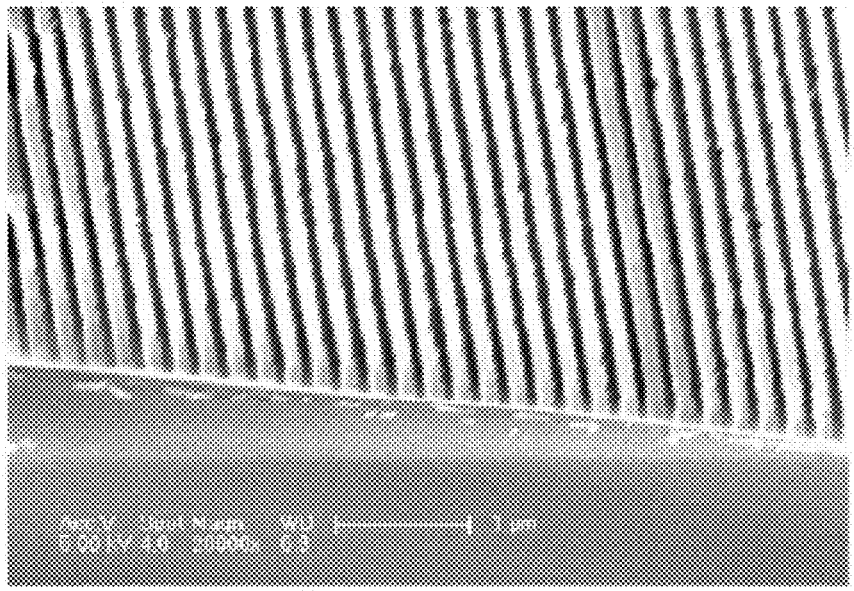
FIGS. 6 and 7 are pictures of the grating taken by a scanning electron microscope.
Figure 7:
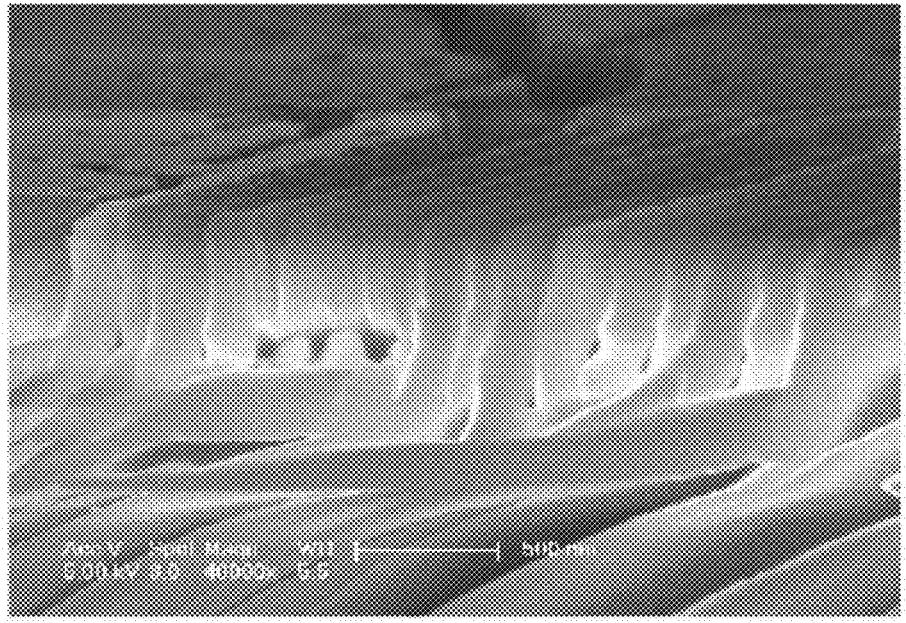

Referring to FIGS. 5 to 7, the grating 10 manufactured by the above method includes the substrate 110. A plurality of protrusions 150 are formed on the surface of the substrate 110. A cavity 160 is formed between every two adjacent protrusions 150. Each of the protrusions 150 has the same size and shape, and each of the cavities 160 has the same size and shape. In addition, the protrusions 150 and the cavities 160 have the same extension direction. Each of the protrusion 150 has two opposite sidewalls, which are about perpendicular to the surface of the substrate 110.

The substrate 110 can be a semiconductor substrate or a silicon-base substrate. The material of the substrate may be gallium nitride (GaN), gallium arsenide (GaAs), sapphire, aluminum oxide, magnesium oxide, silicon, silica, silicon nitride, silicon carbide, quartz, or glass. In the embodiment, the material of the substrate is quartz. In addition, the material of the substrate 110 also may be a P-type semiconductor or an N-type semiconductor, e.g. P-type GaN or N-type GaN. Furthermore, the size, the thickness, and the shape of the substrate are not limited.

Referring to FIG. 5, the length of the protrusion 150 and the cavity 160 is the dimension along the Y axis, the width of the protrusion 150 and the cavity 160 is the dimension along the X axis, the height of the protrusion 150 is the dimension along the Z axis, and the depth of the cavity 160 is the dimension along the Z axis. The width of the protrusion 150 is defined as W1, the width of the cavity 160 is defined as W2, and the depth of the cavity 160 is defined as D1. The ratio of W1 and W2 is defined as a mark-space ratio of the grating 10. The ratio of D1 and W2 is defined as an aspect ratio of the cavity 160. The sum of the W1 and W2 is defined as a duty cycle C1 of the grating 10.

The width W1 of the protrusion 150 is in the range of 25 nm to 150 nm. The depth D1 of the cavity 160 is in the range of about 150 nm to about 900 nm. The width W2 of the cavity 160 is in the range of about 25 nm to about 150 nm. The mark-space ratio is about 1:1. The aspect ratio (D1/W2) is in the range of 6:1 and 8:1. The duty cycle C1 of the grating 10 is in the range of about 50 nm to about 300 nm.

In the embodiment, the width W1 of the protrusion 150 is about 100 nm. The depth D1 of the cavity 160 is about 600 nm. The width W2 of the cavity 160 is about 100 nm. The mark-space ratio is about 1:1. The aspect ratio is about 6:1. The duty cycle C1 of the grating 10 is about 200 nm.

In other embodiments, the parameter can be changed according to the different conditions.

In Example 1, the width of the protrusion W1 150 is about 150 nm. The depth D1 of the cavity 160 is about 900 nm. The width W2 of the cavity 160 is about 100 nm. The mark-space ratio is about 1:1. The aspect ratio is about 6:1. The duty cycle C1 of the grating 10 is about 300 nm.

In Example 2, the width W1 of the protrusion 150 is about 100 nm. The depth D1 of the cavity 160 is about 800 nm. The width W2 of the cavity 160 is about 100 nm. The mark-space ratio is about 1:1. The aspect ratio is about 8:1. The duty cycle C1 of the grating 10 is about 200 nm.

In Example 3, the width W1 of the protrusion 150 is about 50 nm. The depth D1 of the cavity 160 is about 300 nm. The width W2 of the cavity 160 is about 50 nm. The mark-space ratio is about 1:1. The aspect ratio is about 6:1. The duty cycle C1 of the grating 10 is about 100 nm.

In Example 4, the width W1 of the protrusion 150 is about 120 nm. The depth D1 of the cavity 160 is about 720 nm. The width W2 of the cavity 160 is about 120 nm. The mark-space ratio is about 1:1. The aspect ratio is about 6:1. The duty cycle C1 of the grating 10 is about 320 nm.

In Example 5, the width W1 of the protrusion 150 is about 130 nm. The depth D1 of the cavity 160 is about 780 nm. The width W2 of the cavity 160 is about 130 nm. The mark-space ratio is about 1:1. The aspect ratio is about 6:1.

Figure 8:
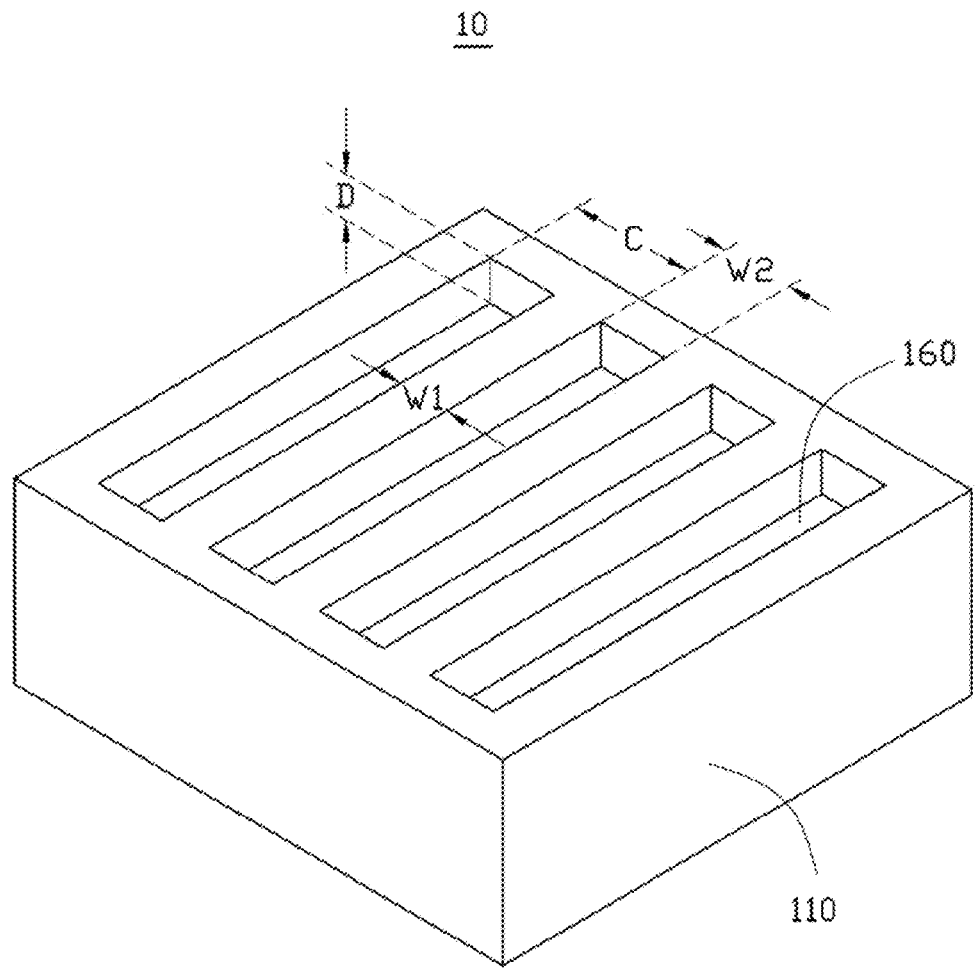
FIG. 8 is another embodiment of a schematic diagram of a grating.

Referring to FIG. 8, another embodiment with a grating 20 includes a substrate 210. The substrate 210 has a plurality of cavities 260. The cavities 260 are parallel to each other and surrounded by a protrusion 250.

The distance between the two cavities 260 is defined as W11, the width of the cavity 260 is defined as W21, and the depth of the cavity 260 is defined as D2. The ratio of W11 and W21 is defined as a mark-space ratio of the grating 20. The ratio of D2 and W21 is defined as an aspect ratio of the cavity 260. The sum of the W11 and W21 is defined as a duty cycle C2 of the grating 20.

The distance W11 between the two cavities 260 is in the range of about 25 nm to about 150 nm. The depth D2 of the cavity 260 is in the range of about 150 nm to about 900 nm. The width W21 of the cavity 260 is in the range of about 25 nm and to 150 nm. The mark-space ratio is about 1:1. The aspect ratio (D2/W21) is greater than or equal to about 6:1. The duty cycle C2 of the grating 20 is in the range of about 50 nm to about 300 nm.

In summary, the width of the cavity of the grating is in the range of about 25 nm to about 150 nm, the aspect ratio is greater than or equal to 6:1 so that the grating of the disclosure is a sub-wavelength grating with high density, high aspect ratio, high mark-space ratio, high diffraction efficiency, and low scattering.

Even though numerous characteristics and advantages of certain inventive embodiments have been set out in the foregoing description, together with details of the structures and functions of the embodiments, the disclosure is illustrative only. Changes may be made in detail, especially in matters of arrangement of parts, within the principles of the present disclosure to the full extent indicated by the broad general meaning of the terms in which the appended claims are expressed.

What is claimed is:

1. A manufacturing method of a grating comprising:
   forming a photoresist film on a surface of a substrate;
   forming a nano-pattern on the photoresist film by nano-imprint lithography;
   forming a patterned photoresist layer by etching the photoresist film, wherein the patterned photoresist layer defines a plurality of cavities, and a first part of the surface of the substrate is exposed through the patterned photoresist layer;
   covering a mask layer on the patterned photoresist layer and entire the first part of the surface of the substrate exposed through the patterned photoresist layer at the same time;
   forming a patterned mask layer by removing the patterned photoresist layer and portions of the mask layer on the patterned photoresist layer, wherein the patterned mask layer is retained on the first part of the surface of the substrate;

etching the substrate through the patterned mask layer by reactive ion etching, wherein etching gases used in the reactive ion etching comprises carbon tetrafluoride, sulfur hexafluoride, and argon; and removing the patterned mask layer.

2. The manufacturing method of claim 1, wherein the substrate comprises a substrate material that is selected from the group consisting of gallium nitride, gallium arsenide, sapphire, aluminum oxide, magnesium oxide, silicon, silica, silicon nitride, silicon carbide, quartz, and glass.

3. The manufacturing method of claim 1, wherein the mask layer comprises chromium.

4. The manufacturing method of claim 1, wherein an etching power is in a range of about 40 watts to about 200 watts.

5. The manufacturing method of claim 1, wherein a pressure of the etching gases is in a range of 1 pascal to 5 pascal.

6. The manufacturing method of claim 1, wherein a second part of the surface of the substrate is exposed through the patterned mask layer after removing the patterned mask layer.

7. The manufacturing method of claim 1, wherein the etching gases further comprise oxygen, and a flow volume of oxygen is in a range of greater than 0 sccm to about 10 sccm.

8. The manufacturing method of claim 7, wherein the carbon tetrafluoride, the sulfur hexafluoride, the argon, and the oxygen are guided into a microwave plasma system simultaneously.

9. The manufacturing method of claim 1, wherein the photoresist film comprises a first layer and a second layer, and the first layer comprises polymethylmethacrylate, and the second layer comprises hydrogen silsesquioxane.

10. The manufacturing method of claim 9, wherein the first layer is disposed adjacent to the substrate.

11. The manufacturing method of claim 1, wherein a flow volume of the etching gases is in a range of about 40 sccm to about 120 sccm.

12. The manufacturing method of claim 11, wherein the flow volume of the etching gases is about 70 sccm.

13. The manufacturing method of claim 11, wherein a flow volume of carbon tetrafluoride is in a range of about 1 sccm to about 50 sccm, a flow volume of sulfur hexafluoride is in a range of about 10 sccm to about 70 sccm, and a flow volume of argon is in a range of about 10 sccm to about 20 sccm.

14. The manufacturing method of claim 13, wherein the flow volume of carbon tetrafluoride is about 40 sccm, the flow volume of sulfur hexafluoride is about 26 sccm, and the flow volume of argon is about 10 sccm.

* * * * *